US006533867B2

(12) United States Patent
Doppelhammer (10) Patent No.: US 6,533,867 B2
(45) Date of Patent: Mar. 18, 2003

(54) SURFACE SEALING SHOWERHEAD FOR VAPOR DEPOSITION REACTOR HAVING INTEGRATED FLOW DIVERTERS

(76) Inventor: Robert Doppelhammer, 2562 Lost Lake Rd., Mound, MN (US) 55364

( * ) Notice: Subject to any disclaimer, the term of this patent is extended or adjusted under 35 U.S.C. 154(b) by 0 days.

(21) Appl. No.: 09/990,971

(22) Filed: Nov. 20, 2001

(65) Prior Publication Data

US 2002/0059904 A1 May 23, 2002

Related U.S. Application Data

(60) Provisional application No. 60/252,141, filed on Nov. 20, 2000.

(51) Int. Cl.[7] ........................ C23C 16/00; C23C 16/455
(52) U.S. Cl. ....................................... 118/715; 118/733
(58) Field of Search ................................. 118/715, 733

(56) References Cited

U.S. PATENT DOCUMENTS

| | | | | |
|---|---|---|---|---|
| 3,854,443 A | * | 12/1974 | Baerg | 118/724 |
| 4,792,378 A | | 12/1988 | Rose et al. | 156/643 |
| 4,993,358 A | * | 2/1991 | Mahawili | 118/715 |
| 5,000,113 A | | 3/1991 | Wang et al. | 118/723 |
| 5,911,834 A | | 6/1999 | Fairbairn et al. | 134/1.3 |
| 6,126,753 A | * | 10/2000 | Shinriki et al. | 118/715 |
| 6,170,492 B1 | | 1/2001 | Ueda et al. | 134/1.1 |
| 6,451,157 B1 | * | 9/2002 | Hubacek | 438/706 |
| 2001/0010207 A1 | | 8/2001 | Yamamoto et al. | 118/723 MW |
| 2002/0059904 A1 | * | 5/2002 | Doppelhammer | 118/715 |

OTHER PUBLICATIONS

Biber, C.R. et al., "Flow regime map and deposition rate uniformity in vertical rotating–disk OMVPE reactors", *Journal of Crystal Growth*, vol. 123, pp. 545–554 (1992).

Breiland, W.G., "Design and Verification of Nearly Ideal Flow and Heat Transfer in a Rotating Disk Chemical Vapor Deposition Reactor", *J. Electrochem. Soc.*, vol. 138, No. 6, pp. 1806–1816 (Jun. 1991).

Emcore Corporation, Somerset, New Jersey, "MOCVD Tools Innovation Leadership Performance Brochure", 15 pages (date unknown).

Tompa, G.S., "Design and Applications of Large Area RDRs", *III–Vs Review*, vol. 7, No. 3, 6 pages (1994).

Thompson, A.G. et al., "The Scaling of CVD Rotating Disk Reactors in Large Sizes and Comparison With Theory", *Journal of Electronic Materials*, vol. 25, No. 9, pp. 1487–1494 (1996).

* cited by examiner

*Primary Examiner*—Jeffrie R. Lund (57) ABSTRACT

The present invention relates to an improved structure of the "showerhead used to introduce gaseous source material into a vapor deposition reactor such as a metal-organic chemical vapor deposition (MOCVD) reactor. The showerhead includes inlet seal assemblies that connect the inlet lines to the showerhead through the use of opposing planar seal faces so as to simplify the process of connecting and disconnecting the inlet lines to the showerhead. In addition, the showerhead includes a gas dispersion assembly on the inner face of the showerhead that optimizes the flow of gaseous material into the reaction chamber. The gas dispersion assembly includes a plurality of webbed disks that define discrete dispersion chambers. The webbed disks include integrally-formed flow diverters that direct the flow of gas into the dispersion chambers so as to create a controlled, uniform flow of material into the reaction chamber.

19 Claims, 6 Drawing Sheets

SURFACE SEALING SHOWERHEAD FOR VAPOR DEPOSITION REACTOR HAVING INTEGRATED FLOW DIVERTERS

CROSS REFERENCE TO PRIOR APPLICATION

This application claims priority of Provisional Application Serial No. 60/252,141, filed on Nov. 20, 2000, which is incorporated herein by reference.

BACKGROUND OF THE INVENTION

The present invention relates to a vapor deposition reactor for depositing a thin layer of material on a substrate. More particularly, the invention relates to improvements in the structure of the "showerhead" that introduces gaseous source material into the vapor deposition reactor.

It is known to form compound semiconductor layers in a vapor deposition reactor through, for example, metal organic chemical vapor deposition (MOCVD). A vapor deposition reactor of this type typically includes a reaction chamber that contains a support for holding a wafer. The support may be rotatable so that the wafer can be rotated during the deposition process. A showerhead generally seals the upper end of the reactor chamber. The showerhead includes a number of gas inlets that facilitate the separate introduction of precursor and carrier gasses into the chamber.

Conventional showerheads generally have complex inlet line configurations. One such example is the rotating disc reactor sold by EMCORE under the name TurboDisc®. With this apparatus, the fitting between the showerhead and the inlet lines requires paired-wrench access, i.e., access for two opposing wrenches, at each inlet line connection location for assembly and maintenance. This greatly complicates design layout, assembly and maintenance of the inlet lines and plumbing.

Another difficulty encountered with conventional rotating disc reactors is depletion and non-uniform injection of the deposition. This is particularly true with larger size reactors capable of handling a larger number of wafers. An article by Thompson et al. entitled "The Scaling of CVD Rotating Disk Reactors to Large Sizes and Comparison with Theory", *Journal of Electronic Materials,* Vol. 25, No. 9, pp. 1487–1494 (1996), the content of which is incorporated herein by reference, describes difficulties in scaling and in achieving uniform injection of the source material into the reaction chamber.

SUMMARY OF THE INVENTION

The present invention overcomes and/or minimizes the problems discussed above with respect to the prior art through a specially designed showerhead for a vapor deposition reactor.

According to one aspect of the invention, an apparatus for chemical vapor deposition includes a reaction chamber, a support within the reaction chamber that supports the substrate, and a showerhead that seals one end of the reaction chamber. The showerhead has an outer surface, an inner surface, and a plurality of inlet seal assemblies for permitting the flow of gaseous material through the showerhead into the reaction chamber. A plurality of inlet lines supply gaseous source material to the reaction chamber. The surface seal assemblies each have a seal body that extends through the showerhead, and a collar around the inlet line. The seal body and the collar each have a substantially planar face seal surface. The fittings are connected to the inlet seals such that face seal surface of each collar abuts the face seal surface of one of the seal bodies. The invention may also include clamping means, such as clamping screws, for causing the face seal surfaces to press together, thereby creating the seal between inlet lines and the inlet seal assemblies. Preferably, the face seal surfaces of the seal bodies are all substantially coplanar to each other and parallel to the outer surface of the showerhead.

According to this first aspect of the invention, the showerhead is surface sealing. In other words, the connection of the inlet lines to the inlet assemblies occurs by pressing of the planar seal surfaces together. The connection of these seals requires only a single tool and the seal clamping screws are easily accessed. Such design makes it easier to connect, clean and maintain the input vapor lines and enhances the flexibility of the inlet line layout. Moreover, it allows the seals between the inlet lines and the showerhead to be formed substantially flush with the upper surface of the showerhead.

According to a second aspect of the invention, an apparatus for chemical vapor deposition includes a reaction chamber, a support disposed within the reaction chamber that supports the substrate, and a showerhead that seals one end of said reaction chamber. The showerhead has an outer surface, an inner surface, a plurality of inlet seal assemblies extending through said inner and outer surfaces so as to permit the flow of gaseous material through the showerhead into the reaction chamber, and a gas dispersion assembly formed on the inner surface of the showerhead. The gas dispersion assembly defines a plurality of cavities, each of which is positioned to receive gaseous material exiting from one of the inlet seal assemblies. The gas dispersion assembly has at least one flow diverter for diverting the flow of gaseous material out of one of the inlet seal assemblies and into one of the cavities, and at least one diffuser screen for diffusing gaseous material as it passes from the cavities into the reaction chamber.

According to this second aspect of the invention, the gas dispersion assembly preferably includes a number of open webbed plates. These plates support the gas dispersion screen(s) and preferably have integrated into them the gas flow diverters that redirect the gas streams entering the reactor via the inlet seals. The cavities are defined on their sides by the arms of these open webbed plates and on their surfaces by the inner surface of the showerhead and/or by the diffuser screens. The cavities can be spaced radially and/or concentrically so that the flow of gaseous material into the chamber can be selectively controlled. In this way, the present invention facilitates uniform deposition of materials while simplifying part cleaning, assembly and maintenance by reducing the number of parts.

Thus, the invention simplifies/streamlines the achievement of optimal flows for chemical vapor deposition of preferably uniform or uniformly conformed thin films and multi-layer films of desired composition, including porous, dense, amorphous, polycrystalline or crystalline film types or multi-layer mixtures of said film types.

DETAILED DESCRIPTION OF THE INVENTION

Figure 1:
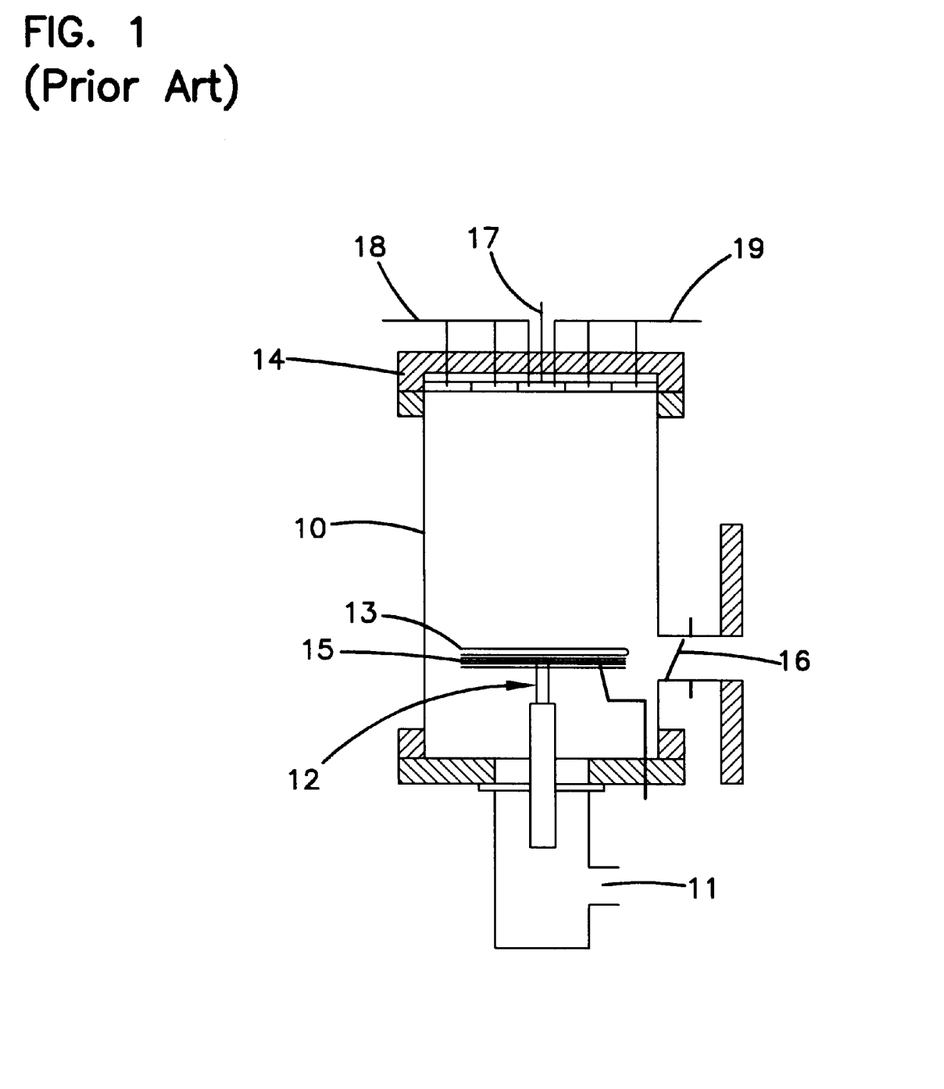
FIG. 1 is a cross-sectional view of a conventional chemical vapor deposition reactor.

A basic reaction chamber, such as the reaction chamber of a rotating disc reactor for metal organic chemical vapor deposition, is shown in FIG. 1. FIG. 1 shows a reaction chamber 10 having a rotating support 12. The support may include a rotating susceptor 13 for supporting a wafer, and a stationary heater 15 for heating the susceptor and wafer. The reaction chamber typically has an exhaust 11 and a shutter 16 for controlling the flow of gas around the wafer.

A showerhead 14 seals the upper end of the reactor chamber. A number of inlet lines 17–19 are connected to the showerhead. The inlet lines generally each carry a different gaseous material. For example, inlet line 18 may supply trimethyl gallium or other source of Group III material, while inlet line 19 supplies arsine or other source of Group V material. Inlet line 17 typically supplies a carrier gas such as hydrogen.

A preferred structure for a showerhead made according to the present invention is shown in FIGS. 2–8. Throughout the Figures, like numerals are used to designate like elements.

Figure 2:
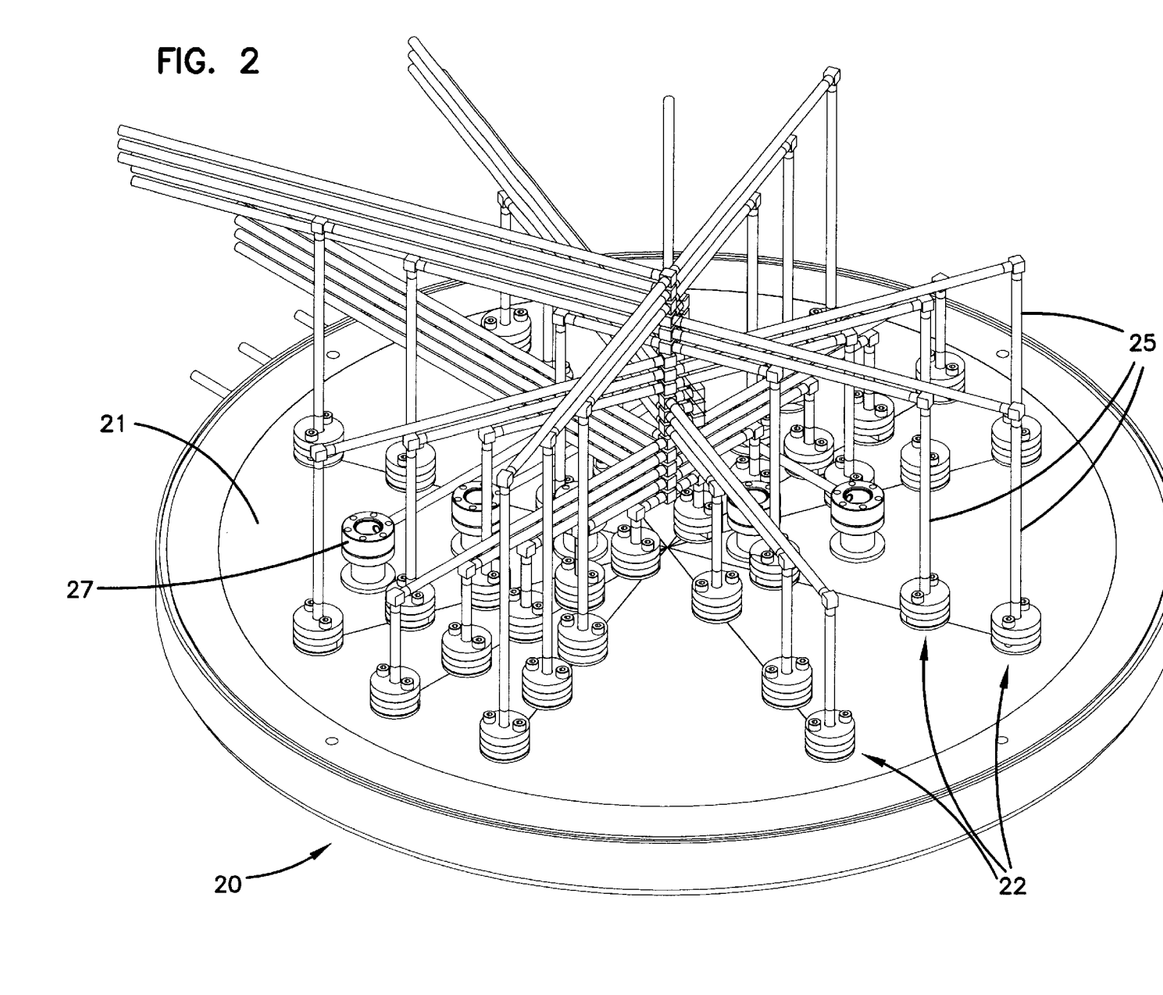
FIG. 2 is perspective view of the upper surface of a showerhead made according to a preferred embodiment of the present invention.
Figure 3:
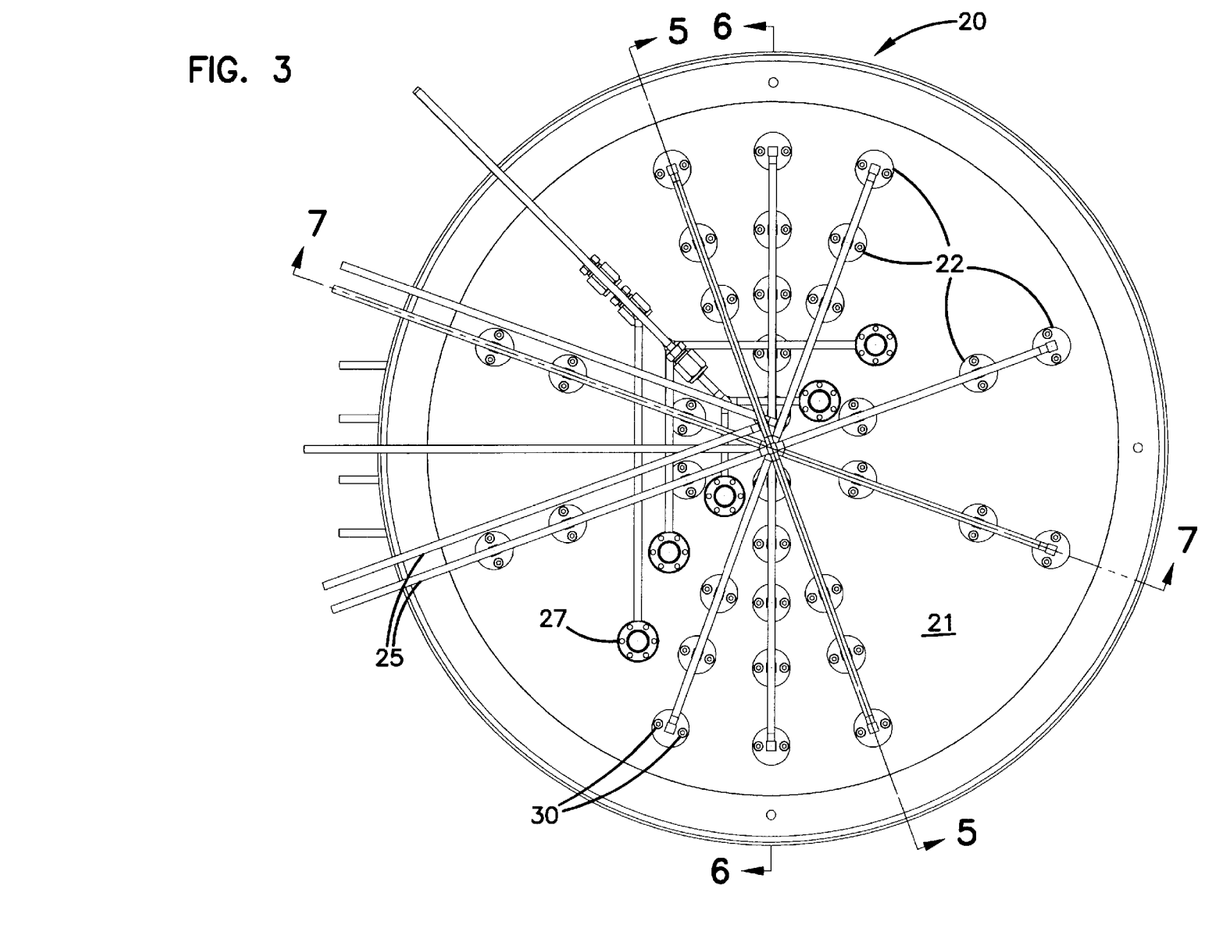
FIG. 3 is a planar view of the upper side of the showerhead shown in FIG. 2.
Figure 4:
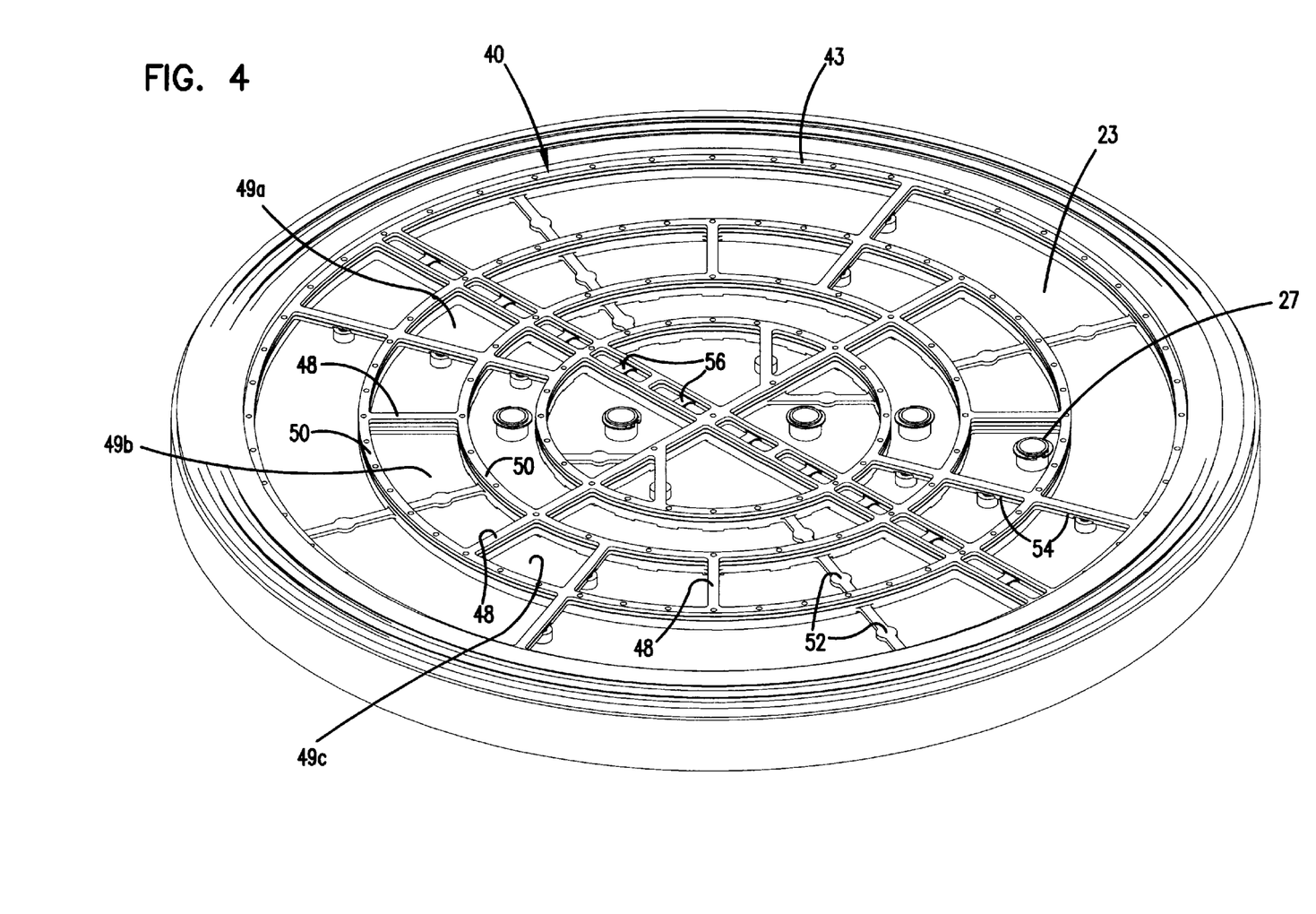
FIG. 4 is a perspective view of the lower surface of the showerhead of FIG. 2, with the diffusion screens omitted for clarity.

Referring first to FIGS. 1–3, a disk-shaped showerhead assembly 20 includes an outer surface 21 and an inner surface 23. Extending through the inner and outer surfaces of the showerhead assembly are a plurality of seal assemblies 22. Inlet lines 25 are connected to each seal assembly. Also extending through the showerhead are a plurality of viewports 27, allowing visual access to the interior of the reaction chamber.

Seal assemblies 22 are preferably arranged symmetrically in pairs, such that one source of gaseous source material feeds into two seal assemblies located in diametrically opposed positions relative to the center of the showerhead. The assemblies are also arranged so as to provide a desired pattern for introduction of source material into the reaction chamber. For example, referring to FIG. 3, the seal assemblies located along lines 5—5 may be for introducing a carrier gas, the seal assemblies located along lines 6—6 may be for introducing a metal-organic compound (such as trimethyl gallium), and the seal assemblies located along lines 7—7 may be for introducing a hydride gas (such as arsine).

Figure 8:
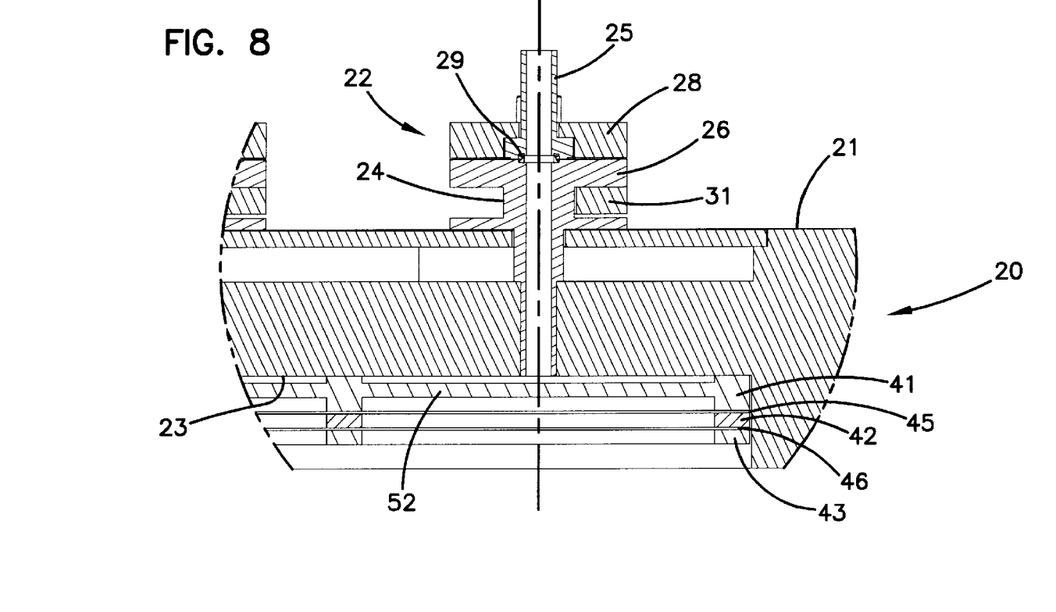
FIG. 8 is an enlarged view of a portion of FIG. 5, showing the seal assemblies in further detail.

The structure of the seal assemblies is best shown in FIG. 8. As seen therein, each seal assembly 22 includes a seal body 24 having an integral flange 26 formed on the outer portion thereof. The assembly also has a rotatable flange 28 and a seal 29. Clamping means includes screws 30 (FIG. 3) and an insert 31 located in a notch below flanges 26. The screws extend perpendicularly through openings in flanges 26 and 28 and engage in threaded holes located in insert 31. Flanges 26 and 28 have planar opposing surfaces so that, upon tightening of the screws 30, they form a face seal with seal 29. This arrangement greatly simplifies the assembly of the inlet lines to the showerhead, since the seals can be attached with a single tool in a direction parallel to the lower portion of the inlet lines.

Seal 28 is preferably made of metal, such as 316 L VIM/VAR. In a preferred embodiment, seal 28 is a 0.205 inside diameter B-C seal by Perkin-Elmer, also known as a TITAN® seal. In order to provide a sufficient seal, the seal seat preferably has a hardness equal to an 85 Rockwell B Scale hardness and the seat surface preferably has a finish equal to a 16 micro-inch roughness average or better.

Figure 5:
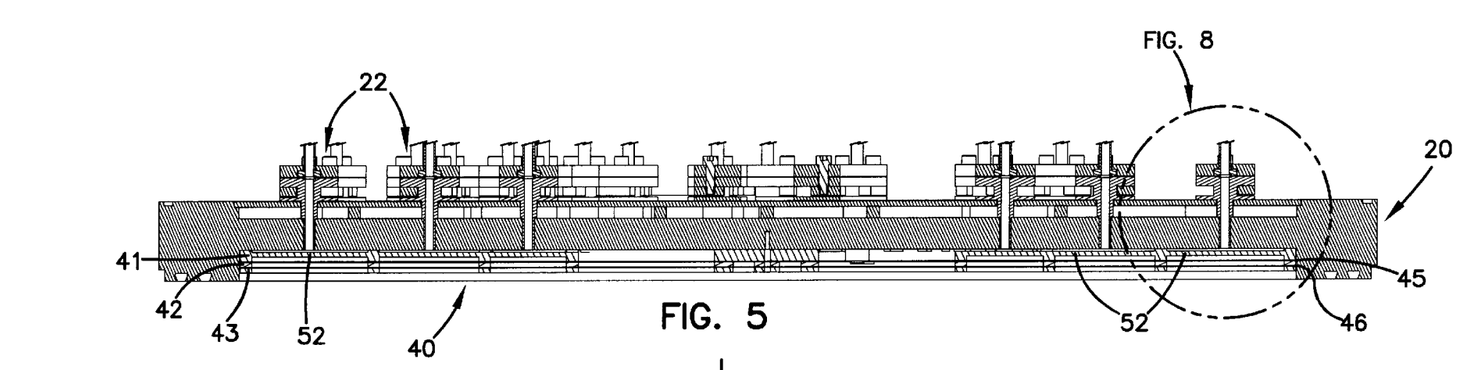
FIG. 5 is a cross-sectional view taken along line 5—5 in FIG. 3.
Figure 6:
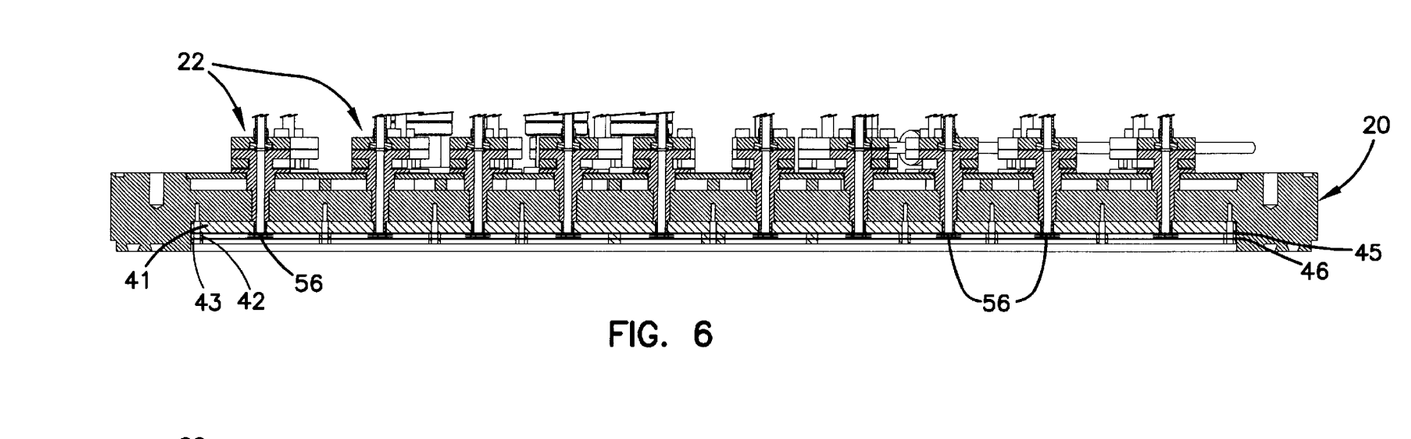
FIG. 6 is a cross-sectional view taken along line 6—6 in FIG. 3.
Figure 7:
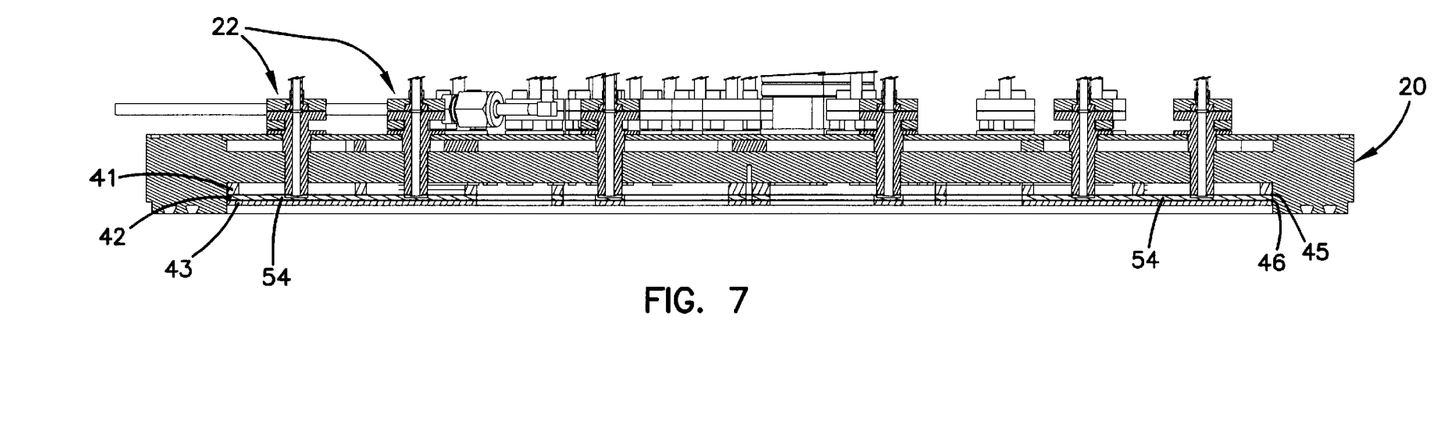
FIG. 7 is a cross-sectional view taken along line 7—7 in FIG. 3.

Referring now to FIGS. 4–7, a gas dispersion assembly 40 is formed on the inner surface of showerhead 20. In the preferred embodiment, dispersion assembly 40 is made up of three webbed disks 41–43 and two gas diffusion screens 45, 46 (for clarity of the drawings, the screens 45 and 46 have been omitted in FIG. 4, but are shown in FIGS. 5–7). The disks and screens are stacked together such that each screen is sandwiched between two of the disks.

As used herein, the term "diffusing screen" refers to a variety of materials that can be used to diffuse the gaseous material as it exits the showerhead, and includes mesh screens, cloth screens, and perforated sheets. A preferred material for the diffusing screen is a metallic cloth made of a corrosion-resistant, heat-resistant material such as molybdenum or stainless steel. Such a cloth is preferably of 200 mesh or finer.

The disks and diffusing screens define a plurality of gas dispersion chambers on the lower portion of the showerhead. For example, disk member 43 has circumferential strip segments 50 and radial strip segments 48 that define chambers 49a, 49b and 49c extending circumferentially around of the lower surface of the showerhead. In the preferred embodiment, two sets of these gas dispersion chambers are defined, one on top of the other. The first set of dispersion chambers are formed between the inner wall of the showerhead and the first diffusion screen 45, while the second set of dispersion chambers are formed between the screens 45 and 46.

Integrally formed as part of the webbed disks 41–43 are gas diverters 52, 54 and 56. Each of these gas diverters is intended to divert gas exiting from one of the seal assemblies into one of the chambers. For example, referring to FIG. 5, gas diverters 52 may be formed as part of inner disk 41 and may be positioned below the seal assemblies to which carrier gas is supplied. Gas diverters 52 thus divert the carrier gas flowing axially into the reaction chamber, and re-directs it radially into the first (upper) set of dispersion chambers. This results in the uniform flow of carrier gas from the first set of dispersion chambers through screen 45 and into the second (lower) set of dispersion chambers.

Similarly, referring now to FIG. 7, gas diverters 54 may be formed as part of the middle disk 42. Gas diverters 54 may be placed below the seal assemblies through which the hydride gas is introduced. Diverters 54 cause the hydride gas to be diverted radially, where it expands to fill chambers in the lower set of dispersion chambers. In these chambers, the hydride gas mixes with the carrier gas diffusing through the first screen 45. The result mixture then diffuses through the second screen 46 into the reaction chamber.

Finally, referring to FIG. 6, gas diverters 56 may also be formed as part of the middle disk 42 and positioned below the seal assemblies through which the metal-organic compounds (typically pre-mixed with a carrier gas) are introduced. Diverters 56 divert this gas flow radially, causing it to fill chambers in the lower set of dispersion chambers before passing through screen 46 and into the reaction chamber.

The result of this structure is the formation of a uniform and controlled flux of material out of the showerhead and directed to the wafer to be coated. Because the dispersion chambers are spaced both radially and circumferentially, the flow of material to each of these chambers can also be individually controlled so as to optimize the flow of material into the chamber and minimize any lack of uniformity in the coating process. The stacked structure of disks and screens also permits easy assembly and disassembly of the gas dispersion assembly 40.

It should be noted that the seal bodies 24 of the inlet seal assemblies are preferably all identical at the outer (seal flange) end. By having the seal flanges 26 all generally parallel and coplanar with each other, the attachment of the inlet lines is further simplified. However, the inner end of seal bodies will vary, depending on whether the seal assembly is supplying carrier gas, hydride gas, or the metal-organic/carrier gas mixture. For example, as shown in FIG. 5, seal assemblies for the carrier gas may terminate essentially flush with the inner surface of the showerhead, so that the gas is introduced into the first set of chambers. In contrast, as shown in FIGS. 6 and 7, the seal assemblies for the hydride and metal-organic gasses extend past the inner surface wall of the showerhead so that the gas is introduced between the two diffusion screens.

The above is for illustrative purposes only. Modification may be made, particularly with regard to size, shape and arrangement of parts. For example, it is to be understood that gas flow diverters 32 may be radial, concentric or a combination thereof. It is to be understood that the present invention is not limited to rotating disc reactors, but also may be used in stationary disc reactors. Other changed can be made without departing from the spirit and scope of the invention. Thus, the scope of the invention should not be limited to the foregoing description, but should be defined with reference to the following claims.

I claim:

1. An apparatus for chemical vapor deposition of a thin layer of material on a substrate, comprising:
   (a) a reaction chamber;
   (b) a support disposed within said reaction chamber which supports the substrate to be coated in the reaction chamber; and
   (c) a showerhead which seals one end of said reaction chamber, said showerhead having an outer surface, an inner surface, and a plurality of inlet seal assemblies for permitting the flow of gaseous material through the showerhead into the reaction chamber, each of said inlet seal assemblies being configured to be connected to a source of gaseous material to be introduced into said reaction chamber;
   wherein each of said inlet seal assemblies comprises a pair of substantially planar seal faces for forming a seal with a source of gaseous material, said seal faces being substantially parallel to the outer surface of the showerhead.

2. The apparatus as claimed in claim 1, wherein the seal faces of the inlet seal assemblies are substantially coplanar with each other.

3. The apparatus as claimed in claim 1, further comprising a plurality in inlet lines for supplying gaseous material to said inlet seals, wherein each of said inlet seal assemblies comprises a collar that surrounds one of said inlet lines, said collar having one of said planar seal faces formed thereon.

4. The apparatus as claimed in claim 3, further comprising means for clamping the inlet seal assemblies such that the seal faces are pressed against one another.

5. An apparatus for chemical vapor deposition of a thin layer of material on a substrate, comprising:
   (a) a reaction chamber;
   (b) a support disposed within said reaction chamber which supports the substrate to be coated in the reaction chamber;
   (c) a showerhead which seals one end of said reaction chamber, said showerhead having an outer surface, an inner surface, and a plurality of inlet seal assemblies for permitting the flow of gaseous material through the showerhead into the reaction chamber; and
   (d) a plurality of inlet lines for supplying gaseous source material to the reaction chamber;
   wherein the inlet seals assemblies comprise a collar surrounding one of the inlet lines and a seal body extending through the showerhead, the collar and seal body each having a substantially planar face seal surface, and wherein the inlet lines are connected to the inlet seal assemblies such that the face seal surfaces of the collar and seal body abut one another.

6. The apparatus as claimed in claim 5, further comprising clamping means for clamping the collars to the seal bodies, said clamping means being actuated in a direction perpendicular to said face seal surfaces.

7. The apparatus as claimed in claim 6, wherein said clamping means comprises at least one bolt extending into each pair of collars and seal bodies.

8. The apparatus as claimed in claim 5, wherein the seal face surfaces of the seal bodies are substantially coplanar with each other.

9. The apparatus as claimed in claim 5, wherein the seal face surfaces of the seal bodies are substantially parallel to the outer surface of the showerhead.

10. An apparatus for chemical vapor deposition of a thin layer of material on a substrate, comprising:
    (a) a reaction chamber;
    (b) a support disposed within said reaction chamber which supports the substrate to be coated in the reaction chamber;
    (c) a showerhead which seals one end of said reaction chamber, said showerhead having an outer surface, an inner surface, a plurality of inlet seal assemblies extending through said inner and outer surfaces so as to permit the flow of gaseous material through the showerhead into the reaction chamber, and a gas dispersion assembly formed on the inner surface of the showerhead;
    wherein the gas dispersion assembly defines a plurality of cavities, each of said cavities being positioned to receive gaseous material exiting from one of the inlet seal assemblies, said gas dispersion assembly comprising at least one flow diverter for diverting the flow of gaseous material out of one of said inlet seal assemblies and into one of said cavities, and at least one diffuser screen for diffusing gaseous material as it passes from said cavities into the reaction chamber.

11. The apparatus as claimed in claim 10, wherein at least some of said cavities are spaced radially from each other.

12. The apparatus as claimed in claim 10, wherein at least some of said cavities are spaced circumferentially from one another.

13. The apparatus as claimed in claim 10, wherein said gas dispersion assembly comprises two of said diffuser screens, and wherein said gas dispersion assembly defines a first set of said cavities between the inner surface of the showerhead and one of the diffuser screens, and a second set of cavities between the diffuser screens.

14. The apparatus as claimed in claim 13, wherein said inlet seal assemblies comprise a first set of inlet seal assemblies that terminate in said first set of cavities and a second set of inlet seal assemblies that terminate in said second set of cavities.

15. The apparatus as claimed in claim 13, wherein said gas dispersion assembly further comprises a first disk located between the inner surface of the showerhead and one of the diffuser screens, and a second disk located between the two diffuser screens, said disks comprising a plurality of strip members that define side walls of the cavities.

16. The apparatus as claimed in claim 15, wherein said first and second disks comprise a plurality of said flow diverters integrally formed with the strip members.

17. The apparatus as claimed in claim 16, wherein said inlet seal assemblies comprise a first set of inlet seal assemblies that terminate in said first set of cavities and a second set of inlet seal assemblies that terminate in said second set of cavities, said flow diverters each comprising a plate member positioned so as to divert gaseous material exiting from one of said inlet seal assemblies.

18. The apparatus as claimed in claim 10, further comprising a plurality of inlet lines for supplying gaseous source material.

19. The apparatus as claimed in claim 18, inlet seal assemblies each have a collar surrounding one of the inlet lines and a seal body extending through the showerhead, wherein the collars and the seal bodies each have a substantially planar face seal surface, and wherein the inlet lines are connected to the inlet seal assemblies such that the face seal surface of each collar abuts the face seal surface of one of the seal bodies.

* * * * *

UNITED STATES PATENT AND TRADEMARK OFFICE
CERTIFICATE OF CORRECTION

PATENT NO. : 6,533,867 B2
DATED : March 18, 2003
INVENTOR(S) : Doppelhammer

It is certified that error appears in the above-identified patent and that said Letters Patent is hereby corrected as shown below:

<u>Title page,</u>
Insert Item:

-- [73] Assignee: Applied EPI, Inc., St. Paul, Minn. --

Signed and Sealed this

Fourteenth Day of December, 2004

JON W. DUDAS
*Director of the United States Patent and Trademark Office*